(12) United States Patent
Natarajan et al.

(10) Patent No.: US 7,005,875 B1
(45) Date of Patent: Feb. 28, 2006

(54) BUILT-IN SELF-TEST CIRCUITRY FOR INTEGRATED CIRCUITS

(75) Inventors: Balaji Natarajan, Santa Clara, CA (US); Paul Tracy, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/775,716

(22) Filed: Feb. 9, 2004

(51) Int. Cl.
*G01R 31/26* (2006.01)

(52) U.S. Cl. .................... 324/765; 324/158.1

(58) Field of Classification Search ........ 324/760–770, 324/158.1, 73.1; 714/724–727, 730–733; 327/265; 360/51
See application file for complete search history.

(56) References Cited

U.S. PATENT DOCUMENTS

| | | | | |
|---|---|---|---|---|
| 4,010,418 A | * | 3/1977 | Salvatore | .................... 324/765 |
| 5,581,177 A | * | 12/1996 | Hussey et al. | ........... 324/158.1 |
| 5,867,332 A | * | 2/1999 | Mattison | ....................... 360/51 |
| 6,008,664 A | * | 12/1999 | Jett et al. | ..................... 324/765 |
| 6,415,402 B1 | * | 7/2002 | Bishop et al. | .............. 714/724 |
| 6,570,426 B1 | * | 5/2003 | Nakashimo | ................. 327/265 |
| 6,618,827 B1 | * | 9/2003 | Benavides | ................... 714/726 |
| 6,717,428 B1 | * | 4/2004 | Spica | ......................... 324/765 |

\* cited by examiner

*Primary Examiner*—Vinh P. Nguyen
(74) *Attorney, Agent, or Firm*—Townsend and Townsend and Crew LLP; J. Matthew Zigmant

(57) ABSTRACT

Circuits, methods, and apparatus for output response analyzers that may be used during integrated circuit testing. Current output test data is compared with previous output test data. In this way, repetitive test patterns such as checkerboards may be employed while limiting circuit complexity. The outputs of several built-in self-test circuits may be combined into as few as one signal that may be provided as a test output.

25 Claims, 7 Drawing Sheets

BUILT-IN SELF-TEST CIRCUITRY FOR INTEGRATED CIRCUITS

BACKGROUND

The present invention relates generally to testing integrated circuits, and more particularly to built-in-test circuits and output response analyzers for integrated circuits.

Integrated circuits are typically tested multiple times while they are manufactured. Often, individual circuits are tested while they are part of a wafer, which contain thousands of integrated circuits. Nonfunctional die are identified, for example with an ink spot, during a test referred to as wafer sort. After wafer sort, the die are separated and packaged. The packaged devices are testing again—this is referred to as final test. Additional testing may be done, for example sample devices may be tested under extreme environmental conditions.

During these tests, test data, also referred to as test vectors, which typically include data and clock signals, are provided to the integrated circuit by a tester. The input test data may be generated by a circuit or software test pattern generator. Conventionally the integrated circuit operates on the input test data and provides output test data back to the tester. An output response analyzer in the tester checks the output test data for errors, and passes or rejects the device.

It is desirable to test each node in an integrated circuit. However, integrated circuits are becoming extremely complicated and may include hundreds of thousands of logic elements. At the same time, it is desirable to reduce the number of pins on the device in order to simplify device packaging and reduce printed circuit board complexity and space. The result is that many internal nodes on integrated circuits are difficult to reach electrically by device pins.

Accordingly, it is desirable to include test circuitry on the integrated circuit itself, such that these internal nodes may be more thoroughly tested. Further, it is desirable to provide an internal test circuit that is capable of testing using test patterns other than simple all ones or all zeros patterns. Also, it is desirable to be able to perform such tests without the addition of complicated circuitry. It is also desirable that the internal circuitry require no or a limited number of pins, such that device pin count may be maintained.

SUMMARY

Accordingly, embodiments of the present invention provide circuits, methods, and apparatus for output response analyzers that may be used during the testing of integrated circuits. Embodiments of the present invention compare current output test data with previous output test data. In this way, repetitive test data such as checkerboard patterns may be used while keeping the built-in-test circuitry very simple. Embodiments may further provide the combining of outputs of several built-in-test circuits into as few as one signal that may be provided as an output. This output may be a dedicated test pin (or pad), it may be an output pin, or it may be another type of device pin.

A better understanding of the nature and advantages of the present invention may be gained with reference to the following detailed description and the accompanying drawings.

DESCRIPTION OF EXEMPLARY EMBODIMENTS

Figure 1:
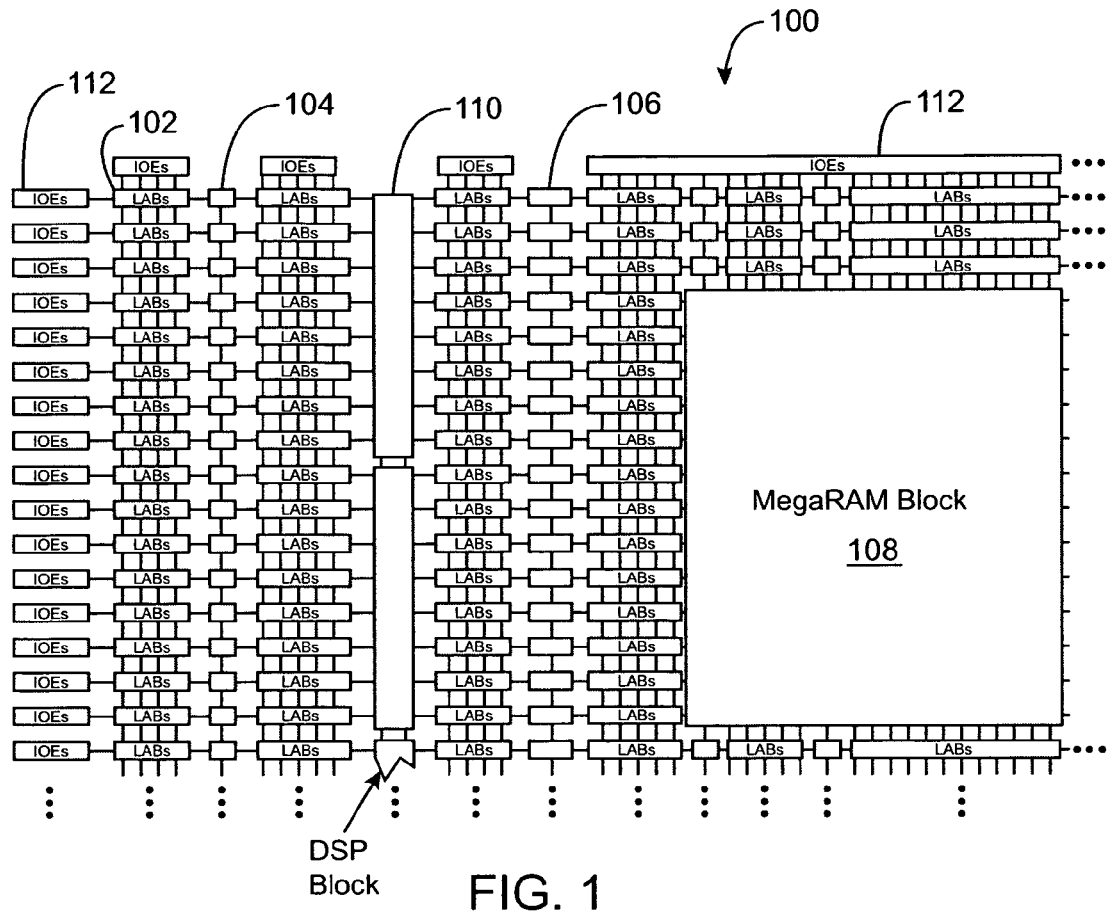
FIG. 1 is a simplified block diagram of a programmable logic device that can implement embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnects of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and a M-Block 108 providing 512K bits of RAM. These memory blocks may also include shift registers and FIFO buffers. PLD 100 further includes digital signal processing (DSP) blocks 110 that can implement, for example, multipliers with add or subtract features. I/O elements (IOEs) 112 located, in this example, around the periphery of the device support numerous single-ended and differential I/O standards. It is to be understood that PLD 100 is described herein for illustrative purposes only and that the present invention can be implemented in many different types of PLDs, FPGAs, and the like. Also, the present invention may be implemented in other types of integrated circuits, such as those including only fixed, non-programmable circuits, or those having a combination of fixed and programmable circuit blocks.

Figure 2:
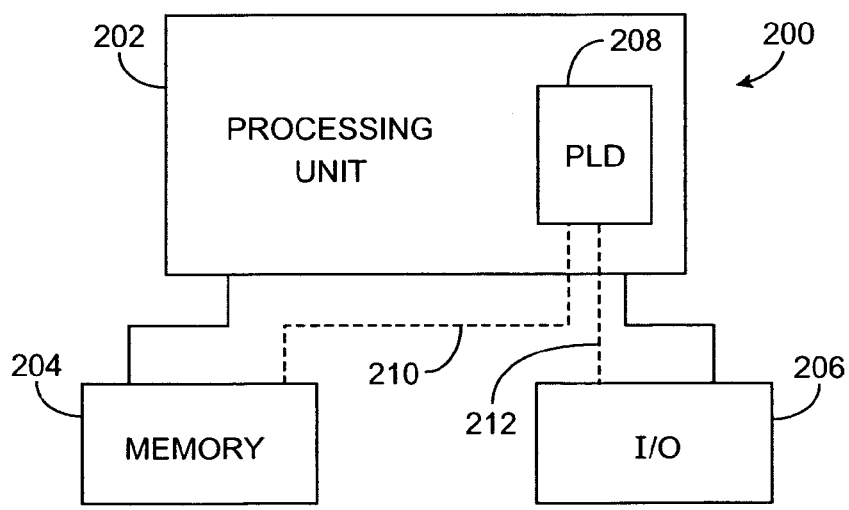
FIG. 2 is a block diagram of an electronic system that may incorporate embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
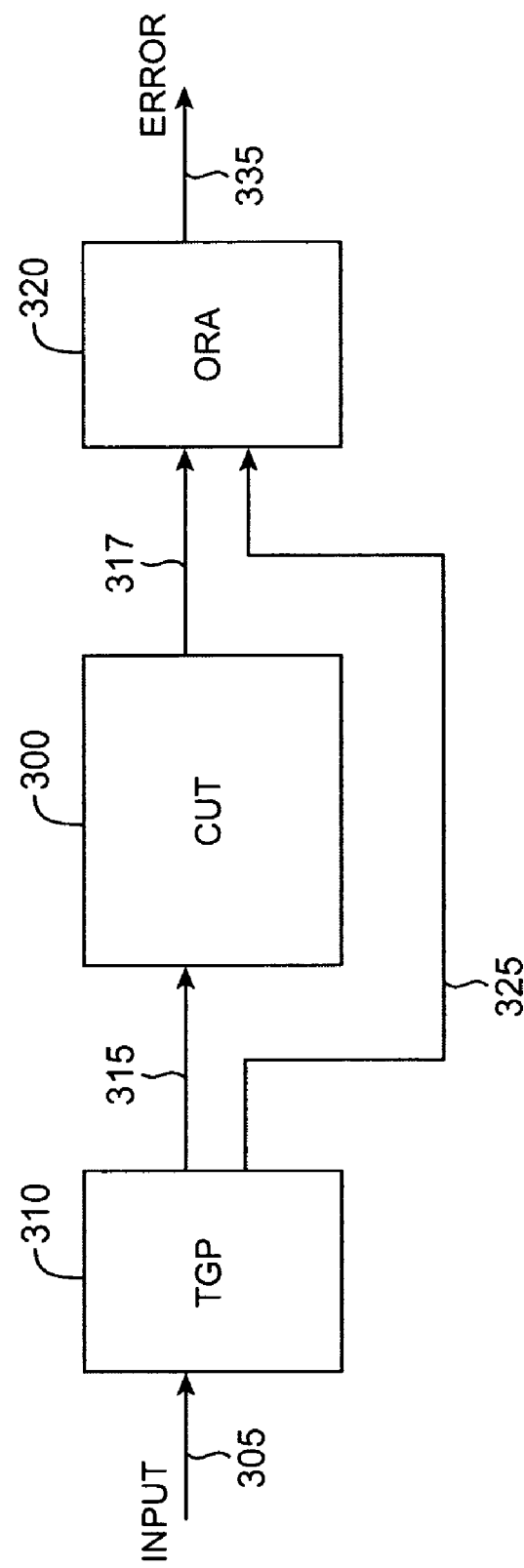
FIG. 3 is a block diagram of a conventional apparatus used for testing an integrated circuit that may be improved by incorporation of an embodiment of the present invention.

FIG. 3 is a block diagram of a conventional apparatus used for testing an integrated circuit that may be improved by incorporation of an embodiment of the present invention. Included are an integrated circuit, the circuit-under-test (CUT) 300, test pattern generator (TPG) 310, and output response analyzer 320.

An input clock is provided on line 305 to the test pattern generator 310. The test pattern generator generates input data and clock signals and provides them to the circuit-under-test 300 on line 315. The circuit-under-test 300 receives this test data and provides an output on line 317 to the output response analyzer 320. The output response analyzer may optionally receive information from the test pattern generator 310 on line 325. The output response analyzer 320 examines the test output data on line 317 in light of the expected data. If the data provided by the circuit-under-test on line 317 is correct, then no error signal is provided on line 335 by the output response analyzer. If an error exists in the data read out from the circuit-under-test on line 317, then the output response analyzer 320 indicates this as an error signal on line 335.

Figure 4:
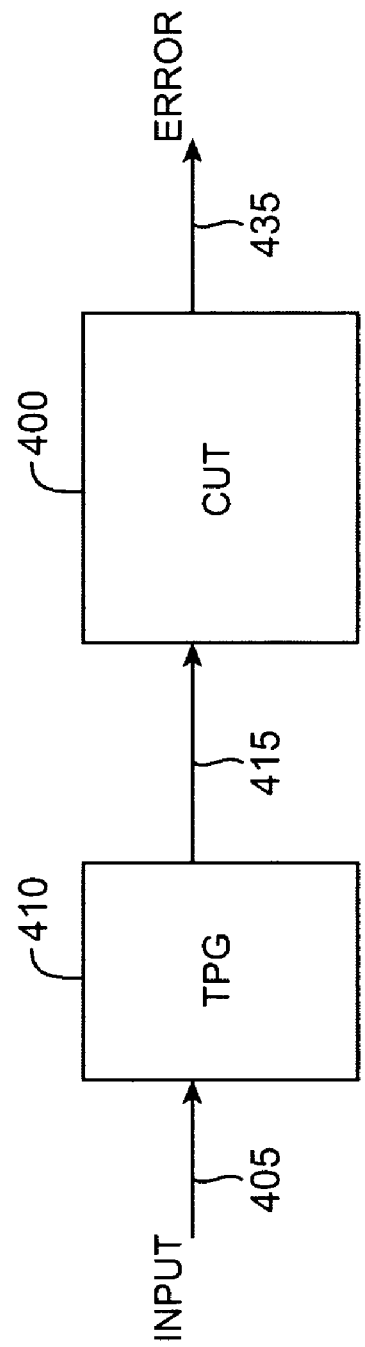
FIG. 4 is a block diagram of an apparatus used in testing integrated circuits in accordance with an embodiment of the present invention.

FIG. 4 is a block diagram of an apparatus used in testing integrated circuits in accordance with an embodiment of the present invention. This block diagram includes a circuit-under-test 400 and a test pattern generator 410. This figure, as with the other included figures, is shown for exemplary purposes only and does not limit either the possible embodiments of the present invention or the claims.

The circuit-under-test may be an integrated circuit, a combination of integrated circuits such as a module or other hybrid device or other circuit type. If the circuit-under-test 400 is an integrated circuit, it may be a field programmable device such as the device of FIG. 1. The test pattern generator 410 may be a software program or module, a hardware circuit, firmware apparatus, or other type of generator. The test pattern generator 410 may be part of a larger test system, for example a test system for testing integrated wafers or packaged devices.

In this embodiment, an output response analyzer is included in the functionality of the circuit-under-test 400. If the circuit-under-test 400 is a field programmable logic device, such as the field programmable logic device shown in FIG. 1, the circuitry required for an output response analyzer may be formed using one or more of the logic elements 110.

The data may be received by the circuit under test 400 through a JTAG port, dedicated pin (or pad), multiplexed pin, or other pin. The error signal may similarly be provided through a JTAG port, dedicated pin, multiplexed pin, or other pin.

The testing performed may be done during wafer sort or final test, as mentioned above. This testing may also be done during power up, for example as part of a self diagnostic routine, in the field as part of a field test or error analysis, or at other appropriate times.

It is also important to check the functionality of the output response analyzer that is part of the circuit-under-test 400. For example, the output response analyzer may be inoperative such that it is incapable of producing an error signal on line 435. Accordingly an embodiment of the present invention provides a test pattern input, and the presence of an error on line 435 is checked. A error is then purposefully introduced, and the error signal on line 435 is checked again.

Figure 5A:
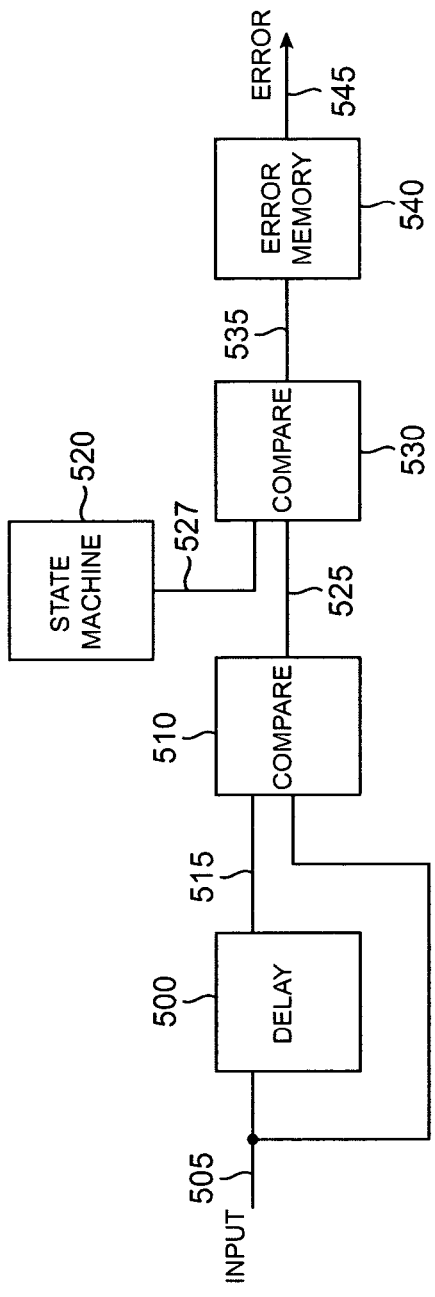
FIG. 5A is a block diagram of a built-in self-test (BIST) circuit or output response analyzer (ORA) that is consistent with an embodiment of the present invention.

FIG. 5A is a block diagram of a built-in self-test (BIST) circuit or output response analyzer that is consistent with an embodiment of the present invention. This block diagram includes a delay circuit 500, a first compare circuit 510, state machine 520, second compare circuit 530, and an error memory 540.

The circuitry being tested may include one or more logic elements, memory cells, or other types of circuitry. This circuitry provides test data on line 505 to the output response analyzer. The delay circuit 500 receives an input on line 505 from a portion of the integrated circuit that is being tested and provides delayed test data at its output. The first compare circuit 510 receives the test data input on line 505, as well as the delayed test data on line 515. The first compare circuit 510 compares the output test data and the delayed output test data and provides an output signal on line 525 to the second compare circuit 530. The state machine 520 provides a control signal on line 527 to the second compare circuit 530.

The second compare circuit 530 compares the output of the first compare circuit 510 on line 525 with the control signal on line 527. The second compare circuit determines whether the output of the first compare circuit 510 on line 525 is correct in light of the control signal on line 527, and provides an output on line 535 to the error memory 540. If the test data on line 552 is correct, the output of the second compare circuit 530 on line 535 remains in a first state, for example, low. If an error is detected, the output of the second compare circuit 530 on line 535 toggles to a second state, for example, high. This changed state is retained by the error memory 540, which provides an error signal on line 545.

Several of these error signals may be combined throughout the chip, for instance using a large OR gate, and provided outside of the circuit-under-test as an error signal. In one integrated circuit that is consistent with an embodiment of the present invention, hundreds of output response analyzers were used.

Figure 5B:
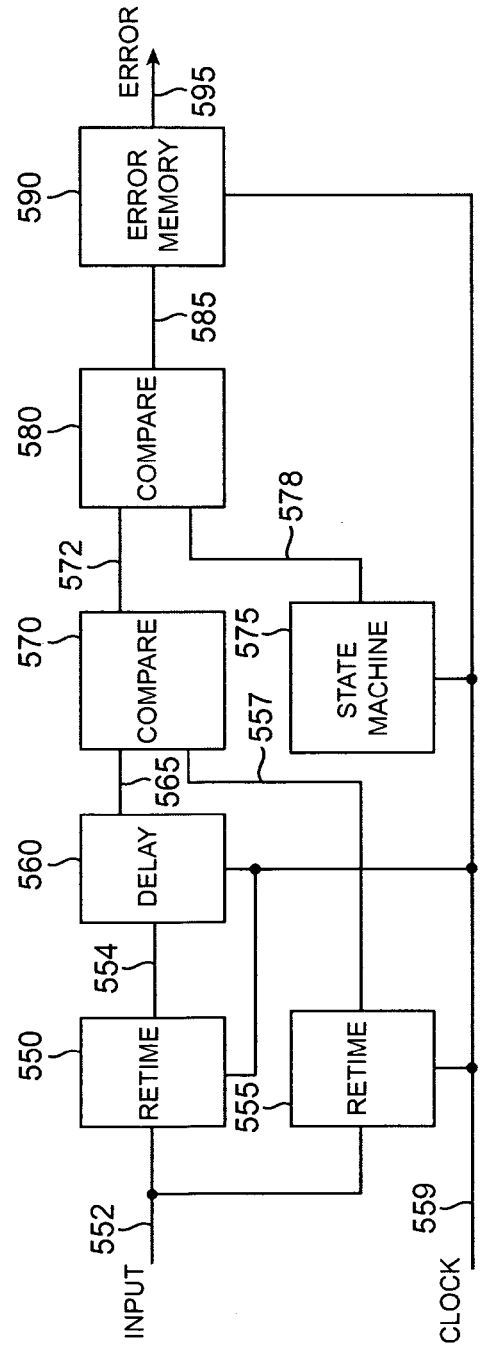
FIG. 5B is a block diagram of an alternative built-in self-test or output response analyzer consistent with an embodiment of the present invention.

FIG. 5B is a block diagram of an alternative built-in self-test or output response analyzer consistent with an embodiment of the present invention. This diagram includes retiming blocks 550 and 555, delay circuits 560, a first compare circuit 570, state machine 575, a second compare circuit 580, and an error memory 590. It will be appreciated by one skilled in the art that variations on this and the other diagrams and schematics shown may be made consistent with embodiments of the present invention. For example, the retiming circuits 550 and 555 may be replaced by a single retiming circuit in some embodiments.

Again, the circuitry being tested may be one or more logic elements, memory cells, or other types of circuitry. This circuitry provides test data as an input signal on line 552 to the built-in self-test circuit. The retiming circuits 550 and 555 retime the input signal to a clock signal on line 559. The delay circuit 500 receives an input on line 505 from the first retiming circuit 550, and provides a delayed signal on line 565 to the first compare circuit 570. The first compare circuit 510 receives this delayed signal, as well as retimed test data provided by the retiming circuit 555 on line 557. The first compare circuit 510 compares the delayed test data and the retimed test data and provides an output signal on line 572 to the second compare circuit 580. The state machine 575 provides a control signal on line 578 to the second compare circuit 580.

The second compare circuit 580 compares the output of the first compare circuit 570 on line 572 with the control signal on line 578. The second compare circuit determines whether the output of the first compare circuit 570 on line 572 is correct in light of the control signal on line 578, and provides an output on line 585 to the error memory 590. If the test data on line 552 is correct, the output of the second compare circuit 580 on line 585 remains in a first state. If an error is detected, the output of the second compare circuit 580 on line 585 toggles to a second state. This change in state is retained by the error memory 590, which provides an error signal on line 595. As before, several of these error signals may be combined throughout the chip, for instance using a large OR gate, and provided outside of the circuit-under-test as an error signal.

One or both of the retiming blocks 550 and 555 may be preloaded with data, set, reset, cleared or otherwise initialized such that they are consistent with the test output data. It establishes an initial condition against which the rest of the test output data is evaluated.

Figure 6:
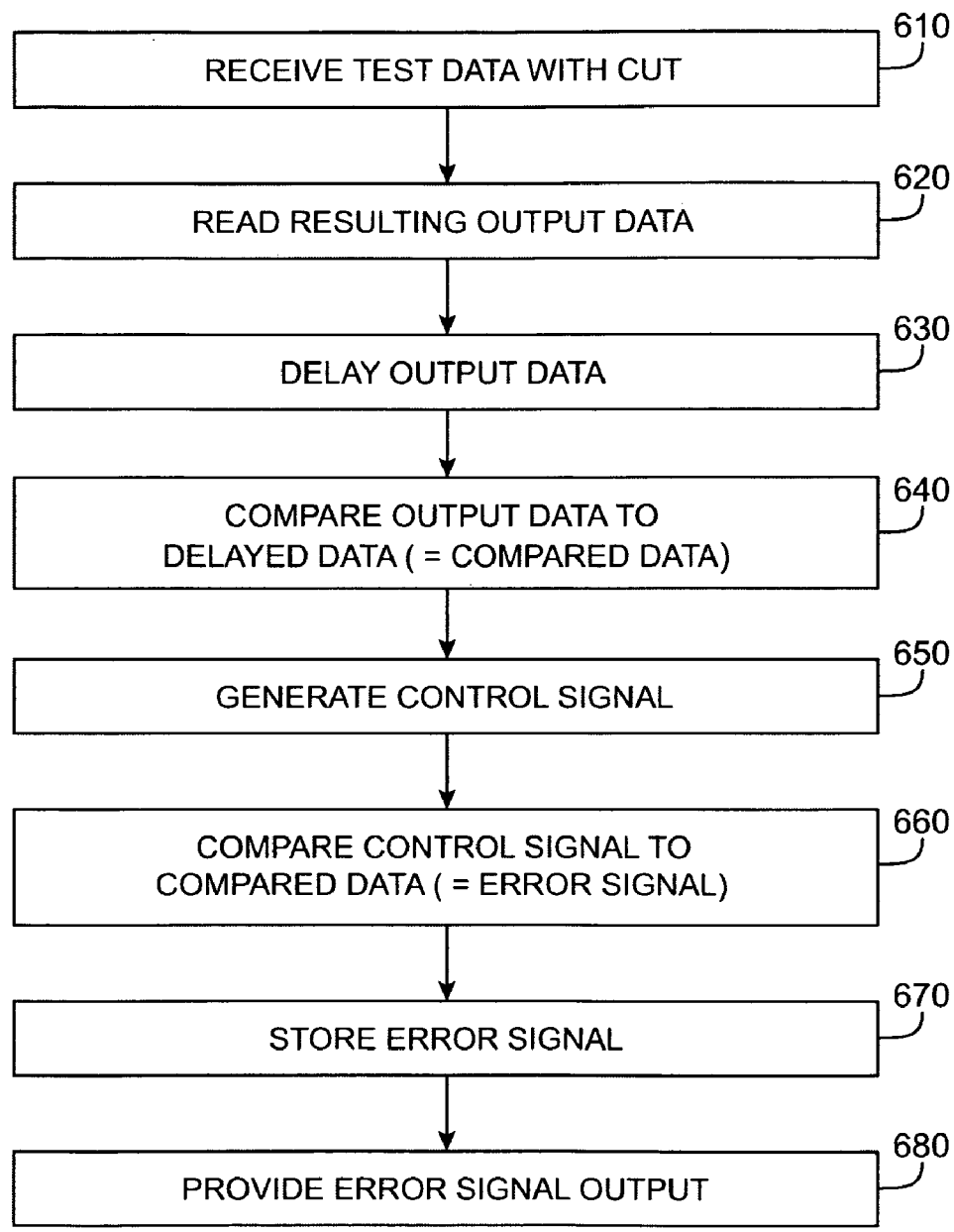
FIG. 6 is a flowchart of a method of testing an integrated circuit consistent with an embodiment of the present invention.

FIG. 6 is a flowchart of a method of testing an integrated circuit consistent with an embodiment of the present invention. In act 610, test data is received by a circuit-under-test. Test output data is read out of a portion of the circuit-under-test in act 620. In act 630, this test output data is delayed. In a specific embodiment of the present invention, the output test data is delayed by one clock cycle. In other embodiments of the present invention, the output may be delayed a different amount, for example, more than one clock cycle.

In act 640, the output data is compared to the delayed data, thus generating a compared data output. In act 650, a control signal is generated. This control signal is an appropriate signal given the test data provided to the circuit-under-test. In act 660, the control signal is compared to the compared data signal, thus generating an error signal. In act 670, the error signal is stored. In a specific embodiment of the present invention, the presence of an error bit is retained or latched as an error signal. In act 680, the error signal is provided as an output.

Figure 7:
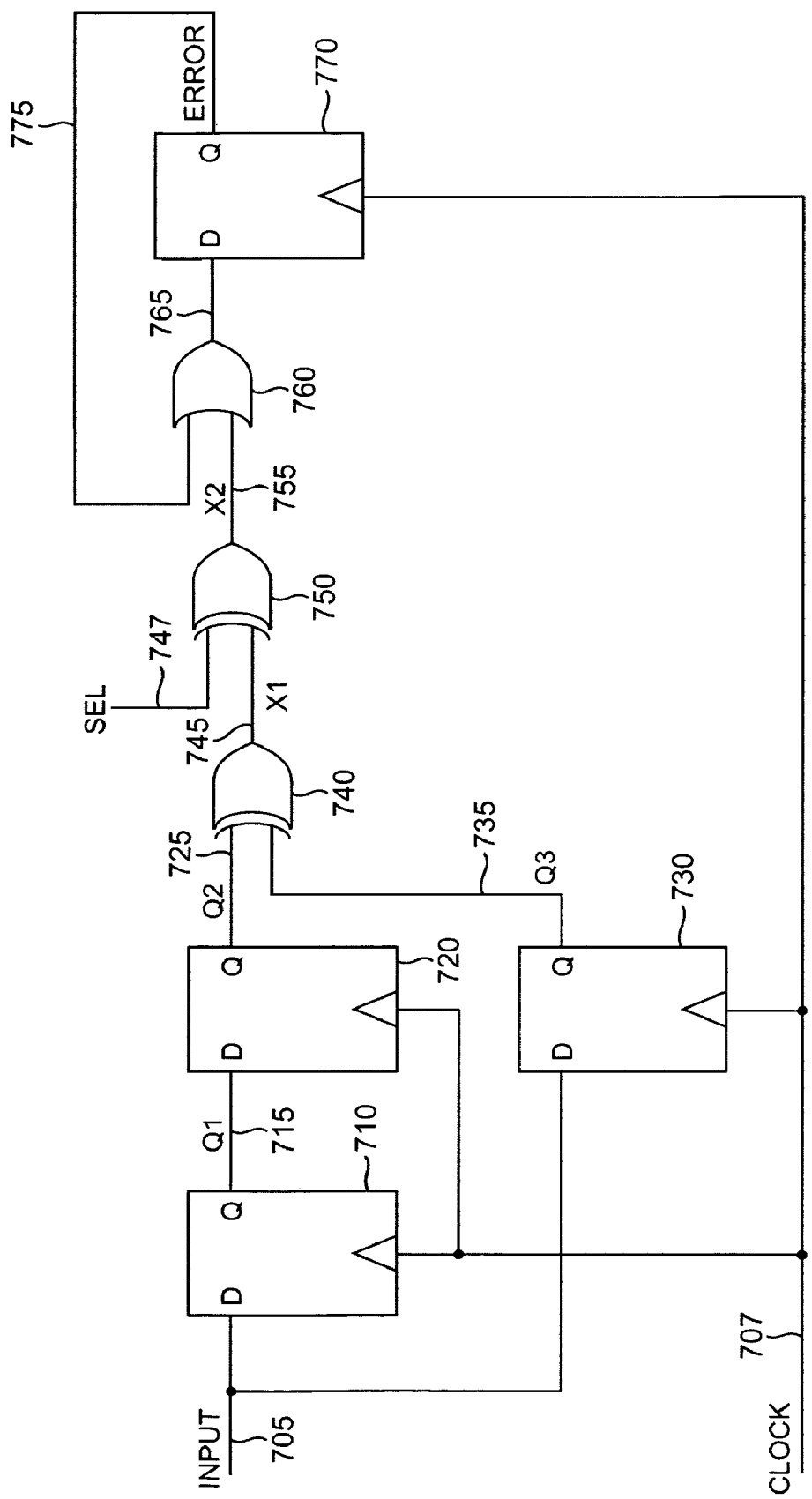
FIG. 7 is a schematic of a specific implementation of a built-in self-test circuit or output response analyzer consistent with an embodiment of the present invention.

FIG. 7 is a schematic of a specific implementation of a built-in self-test circuit or output response analyzer consistent with an embodiment of the present invention. This specific implementation includes a first flip-flop 710, and second flip-flop 720, and third flip-flop 730, a first exclusive-OR gate 740, a second exclusive-OR gate 750, OR gate 760, and a fourth flip-flop 770.

As before, test data is received on line 705 from a portion of an integrated circuit or circuit-under-test. This data is retimed to a clock signal received on line 707. Specifically, the input data on line 705 is retimed by the first flip-flop 710 and the second flip-flop 730 as signals Q1 on line 715 and Q3 on line 735. The signal Q1 on line 715 is delayed by one clock cycle by the second flip-flop 720, and provided as an output Q2 on line 725.

The first exclusive-OR gate 740 compares signals Q2 on line 725 and Q3 on line 735. If these two signals are the same, the exclusive-OR gate 740 provides a high signal, specifically X1 on line 745 is asserted high. If these two signals are different, the output X1 on line 745 of the first exclusive-OR gate 740 is low.

A select or control signal is provided on line 747, for example, from a state machine or other logic circuit. The second exclusive-OR gate 750 compares the select line 747 with the output of the first exclusive-OR gate X1 on line 745. If these two signals are equal, the output of the second exclusive-OR gate 750, the signal X2 on line 755, is high, while if they are different, the signal X2 on line 755 is low.

When the output of the second exclusive-OR gate 750 X on line 755 is high, the OR gate 760 provides a high on line 765 to the fourth flip-flop 770. When this high signal is latched by the fourth flip-flop 770, the error signal on line 775 goes high, and feeds back to the OR gate 760, thus ensuring that the signal on line 765 remains high if the signal X2 on line 755 returns to a low state. In this way, the presence of a high data bit in a stream of data of the signal X2 on line 755 toggles the error signal 775 to a high, where it remains until the fourth flip-flop 770 is reset—that is, if it is reset before the circuit-under-test is discarded as being nonfunctional. In this way, a single error in the input bitstream received on line 705 causes the error signal on line 775 to be asserted high.

This specific embodiment provides a simple yet elegant output response analyzer that is capable of determining the presence of errors in several different test patterns. For example, an all ones (1111) or all zeros pattern may be checked by setting the select or control signal on line 747 to a low. Similarly, a checkerboard (010101) or ncheckerboard (101010) pattern may be verified with the select signal set to a high level.

More complicated patterns, such as 11001100, can also be verified. In this case, the select signal toggles between high and low each data bit. This can easily be generated by a divide by two circuit clocked by the clock signal on line 707. Other patterns may be verified using more complicated state machines to generate the select or control signal on line 747. Moreover, greater depths may be used by embodiments of the present invention, for example the exclusive-OR gate 740 may check more than two bits at a time, for example, four or eight bits may be checked, allowing for more complicated test patterns.

It will be appreciated by one skilled in the art that variations on this circuit may be made consistent with an embodiment of the present invention. For example, first flip-flop 710 and the third flip-flop 730 may be combined. Also, the second exclusive-OR gate 750 may be placed in front of the second flip-flop 720.

Figure 8:
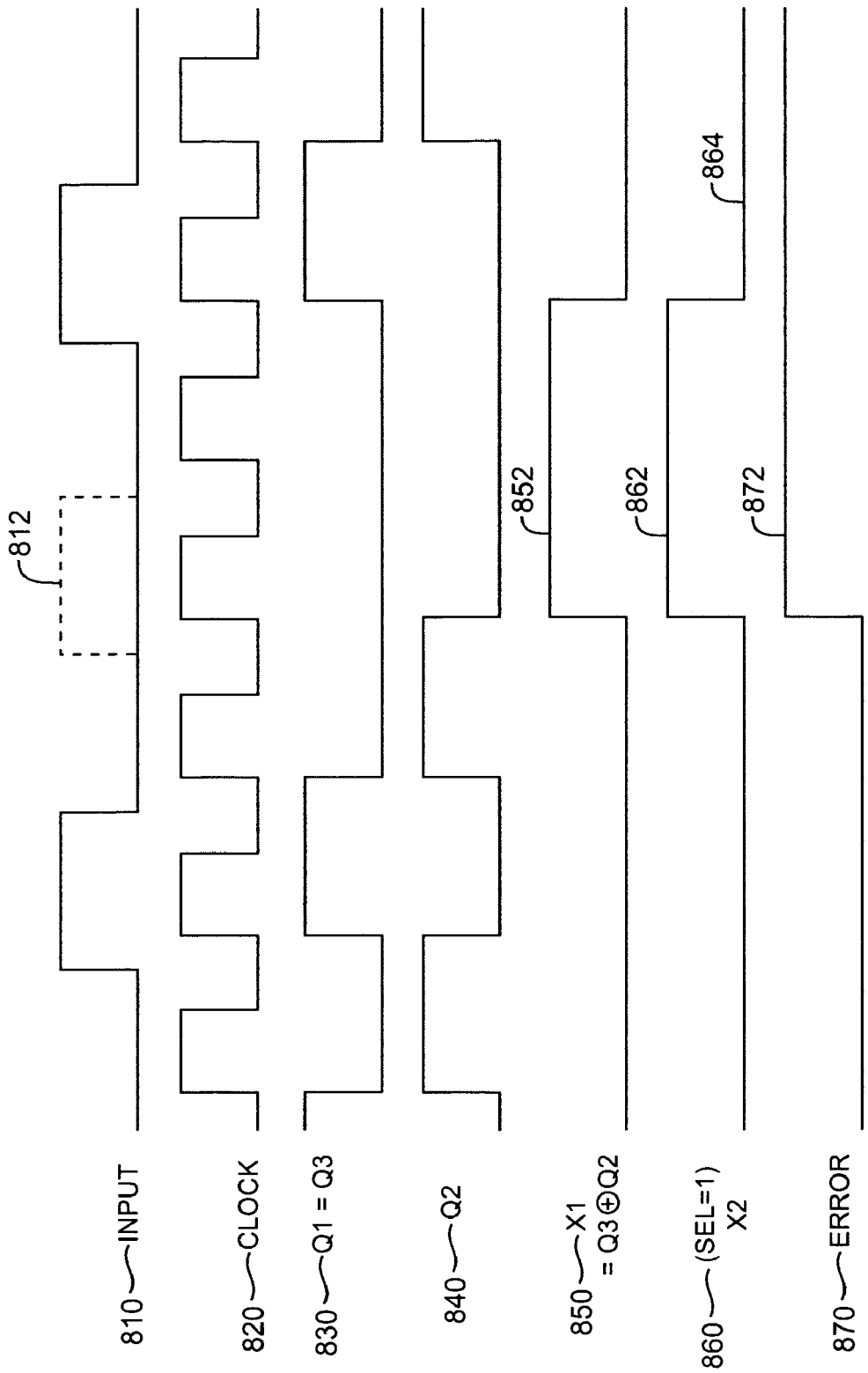
FIG. 8 is a timing diagram for the specific implementation of the present invention shown in FIG. 7.

FIG. 8 is a timing diagram for the specific implementation of the present invention shown in FIG. 7. This timing diagram includes input signals test data input 810 and clock 820, and resulting signals Q1 830, Q2 840, X1 850, X2 860, and error 870.

The input signal 810 would ideally be a checkerboard pattern as described above, except bit 812 is missing. The input signal 810 is a test data output provided by a portion of an integrated circuit or circuit-under-test. The input signal 810 is retimed to the clock signal 820 as Q1 830, which is equal to Q3, 830. The signal Q1 830 is delayed by one clock cycle and provided as signal Q2 840.

If signal X1 815 is the exclusive-OR product of Q3 830 and Q2 840. Accordingly, signal X1 850 remains low of the until pulse 852, which is caused by the missing data bit 812 above. In this particular case, the control or select signal is high, accordingly X2 816 goes high at pulse 862. The error signal 870 to is asserted high at 872, where a remains in despite X2 860 and returning low at 864.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of testing an integrated circuit comprising:
   receiving test output data from a circuit-under-test;
   delaying the test output data;
   comparing the test output data with the delayed test output data to generate a first compare signal;
   generating a control signal; and
   comparing the control signal to the first compare signal to generate a second compare signal.

2. The method of claim 1 further comprising:
   if the second compare signal toggles from a first state to a second state while receiving the test output data; then
   providing a signal indicating an error; else
   providing a signal indicating no error.

3. The method of claim 1 further comprising:
   changing the control signal such that the second compare signal toggles from the first state to the second state.

4. The method of claim 1 further comprising:
   toggling the control signal when the test output data is expected to toggle.

5. The method of claim 3 further comprising:
   after changing the control signal such that the second compare signal toggles from the first state to the second state;
   providing a signal indicating an error.

6. The method of claim 1 further comprising:
   after receiving test output data from a circuit-under-test; and
   retiming the test output data to a clock signal, the clock signal comprising a plurality of clock cycles.

7. The method of claim 6 wherein the test output data is delayed one clock cycle.

8. The method of claim 1 wherein the delay is done using a flip-flop.

9. The method of claim 1 wherein the test output data and the delayed test output data are retimed to a clock signal, the clock signal comprising a plurality of clock cycles.

10. The method of claim 9 wherein the retiming circuit s are preloaded with expected data to generate a first compare signal.

11. The method of claim 8 wherein the comparing the test output data with the delayed test output data to generate a first compare signal and comparing the control signal to the first compare signal to generate a second compare signal are done using a first exclusive-OR gate and a second exclusive-OR gate.

12. An integrated circuit comprising:
   a plurality of logic elements coupled to receive a test data input;
   a delay circuit coupled to receive a test data output from the plurality of logic elements;
   a first compare circuit coupled to an output of the delay circuit and further coupled to receive the test data output; and
   a second compare circuit coupled to an output of the first compare circuit and further coupled to receive a control signal,
   wherein the control signal is based on the test data input.

13. The integrated circuit of claim 12 further comprising:
   a retiming circuit coupled to the delay circuit.

14. The integrated circuit of claim 13 further comprising:
   a state machine coupled to the second compare circuit.

15. The integrated circuit of claim 12 wherein the first compare circuit and the second compare circuit are exclusive-OR gates.

16. The integrated circuit of claim 12 wherein the integrated circuit is a field programmable logic device further comprising:
   a plurality of logic elements coupled by a plurality of programmable interconnect lines,
   wherein the plurality of logic elements are coupled to the delay circuit by at least one of the plurality of programmable interconnect lines.

17. The integrated circuit of claim 16 further comprising:
   an error memory circuit coupled to the second compare circuit.

18. An integrated circuit comprising:
   a series combination including a retiming circuit in series with a delay circuit, wherein the retiming circuit is configured to retime test data to a clock signal and the delay circuit is configured to delay the test data;
   a first compare circuit coupled to receive an output of the series combination;
   a second compare circuit coupled to receive an output of the first compare circuit, and further coupled to receive a control signal.

19. The integrated circuit of claim 18 wherein the delay circuit has an input coupled to an output of the retiming circuit.

20. The integrated circuit of claim 18 wherein a state machine is configured to provide the control signal.

21. The integrated circuit of claim 20 further comprising a second retiming circuit configured to retime the test data and provide an output to the first compare circuit.

22. The integrated circuit of claim 18 wherein the first compare circuit and the second compare circuit are exclusive-OR gates.

23. The integrated circuit of claim 18 wherein the integrated circuit is a field programmable logic device further comprising:

a plurality of logic elements coupled by a plurality of programmable interconnect lines.

24. The integrated circuit of claim 18 wherein the error circuit comprises an OR gate having an output coupled to an input of a flip-flop, the OR gate configured to receive an output from the flip-flop and the output from the second compare circuit.

25. The integrated circuit of claim 24 further comprising:

a error circuit coupled to receive an output of the second compare circuit.

* * * * *